US011189496B2

United States Patent
Yin et al.

(10) Patent No.: US 11,189,496 B2
(45) Date of Patent: Nov. 30, 2021

(54) PLASMA REACTOR FOR ULTRA-HIGH ASPECT RATIO ETCHING AND ETCHING METHOD THEREOF

(71) Applicant: Advanced Micro-Fabrication Equipment Inc. China, Shanghai (CN)

(72) Inventors: Gerald Zheyao Yin, Shanghai (CN); Yichuan Zhang, Shanghai (CN); Jie Liang, Shanghai (CN); Xingcai Su, Shanghai (CN); Tuqiang Ni, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 0 days.

(21) Appl. No.: 16/743,748

(22) Filed: Jan. 15, 2020

(65) Prior Publication Data

US 2020/0251345 A1 Aug. 6, 2020

(30) Foreign Application Priority Data

Feb. 2, 2019 (CN) .......................... 201910107649.6

(51) Int. Cl.
| | |
|---|---|
| *H01L 21/311* | (2006.01) |
| *H01L 21/67* | (2006.01) |
| *H01J 37/32* | (2006.01) |

(52) U.S. Cl.
CPC .... *H01L 21/31116* (2013.01); *H01J 37/3244* (2013.01); *H01J 37/32082* (2013.01); *H01L 21/67069* (2013.01); *H01J 2237/334* (2013.01)

(58) Field of Classification Search
CPC .......... H01L 21/31116; H01L 21/67069; H01J 37/3244; H01J 37/32082; H01J 37/32165
See application file for complete search history.

(56) References Cited

U.S. PATENT DOCUMENTS

| | | | |
|---|---|---|---|
| 2002/0125207 A1* | 9/2002 | Ono ................... | H01L 21/32137 216/2 |
| 2015/0000842 A1* | 1/2015 | Hirano .............. | H01J 37/32045 156/345.28 |
| 2017/0345619 A1* | 11/2017 | Ohtake ............. | H01J 37/32165 |
| 2017/0365487 A1* | 12/2017 | Shen ..................... | C23C 16/402 |
| 2020/0006073 A1* | 1/2020 | Smith ..................... | C23C 16/52 |
| 2020/0058470 A1* | 2/2020 | Ventzek ............ | C23C 16/45536 |

* cited by examiner

*Primary Examiner* — Binh X Tran
(74) *Attorney, Agent, or Firm* — Womble Bond Dickinson (US) LLP; Joseph Bach, Esq.

(57) ABSTRACT

Disclosed are a plasma reactor for ultra-high aspect ratio etching and an etching method therefor, wherein the plasma reactor comprises: a reaction chamber inside which a reaction space is formed; a base disposed at the bottom of the reaction space and configured for supporting a to-be-processed substrate; a gas showerhead disposed at the top inside the reaction chamber; wherein a first radio frequency power supply outputs a radio frequency power with a first frequency to the base or the gas showerhead so as to form and maintain plasma in the reaction chamber; and a second radio frequency power supply which outputs a radio frequency power with a second frequency to the base so as to control the ion energy incident to the base; wherein the first frequency is not less than 4 MHz, and the second frequency is not less than 10 KHz but not more than 300 KHz.

13 Claims, 7 Drawing Sheets

PLASMA REACTOR FOR ULTRA-HIGH ASPECT RATIO ETCHING AND ETCHING METHOD THEREOF

RELATED APPLICATION

The present application claims priority to and the benefit of Chinese Patent Application No. 201910107649.6, filed on Feb. 2, 2019, and the disclosure of which is hereby incorporated herein by reference in its entirety.

FIELD

The disclosure relates to plasma etching reactors, and more particularly relates to a capacitively coupled plasma etching reactor for ultra-high aspect ratio etching.

BACKGROUND

A semiconductor chip manufacturing process requires a considerable amount of micro-processing. Typical plasma etching reactors may form various kinds of through-holes or grooves of micro or nanometer scale on a substrate; in further combination with other processes such as CVD (Chemical Vapor Deposition), various kinds of semiconductor chip products are finally fabricated.

FIG. 1 shows a typical capacitively coupled plasma etching reactor, comprising a chamber body 101, a base 10 disposed at the bottom inside the chamber body, wherein the base simultaneously serving as a lower electrode is connected to a high-frequency radio-frequency (RF) power supply HF and a low-frequency RF power supply LF. On the base is provided an electrostatic chuck 21 configured for holding a to-be-processed substrate 100, and an ancillary edge ring 22 is provided surrounding the electrostatic chuck and the substrate. A flat panel-shaped gas showerhead 11 is provided at the top inside the reaction chamber, the gas showerhead 11 being communicative with an external gas source 200 via a pipeline. During the plasma etching process, the high-frequency energy inputted by the high-frequency RF power supply HF (e.g., with frequencies of 27 MHz, 60 MHz) ionizes the reactant gas introduced into the reaction chamber to generate plasma P, and the electric field inputted by the low-frequency RF power supply LF (e.g., with a frequency of 2 MHz) into the base enables generation of enough DC bias voltage in the sheath of the upper substrate surface to accelerate ions to move downward to bombard substrate for etching.

With advancement of technologies, ultra-high aspect ratio etching gains more and more applications and demands. For example, in the memory field, 3D NAND flash memories become one of dominant memory chip structures. A process of fabricating a 3D NAND chip comprises: first, forming silicon oxide layers and silicon nitride layers stacked alternately, wherein the number of layers may reach 64 layers or even hundreds of layers; then, plasma etching through all of these layers. The overall thickness of these layers is very large, greater than 5 µm or even over 8 µm, the plasma etching is one typical ultra-high aspect ratio etching. The RF energy control system in the above conventional plasma etching reactors cannot drive the ions to the bottom of the through-hole of the etched layers, causing failure of etching the through-hole.

Generally, the hole or trench depth that can be accessed during dielectric etching process is mainly depend on the depth that can be accessed by the ions in the plasma. Therefore, an "ion restricted" process stage always occurs in the ultra-high aspect ratio (>40) etching process. This is because the ions after transiting through the sheath have limited energies; in addition, the electric field formed by charges accumulated on the sidewall of the deep hole exerts a repellent force against the ions, such that with increase of etched depth, the number of ions reaching the bottom of the hole becomes much fewer; or, even the ions can reach the bottom, their energies do not suffice to assist the etching agent (active group) to continue etching the bottom material, causing the hole depth unable to satisfy process requirements. Therefore, the keys to overcome this process problem are how to enhance ion energy and lower charge accumulation effect.

FIG. 2 shows a charge distribution map inside the substrate during a plasma etching procedure. A dielectric layer 103 is deposited on a substrate base layer 100, wherein the dielectric layer may be a homogeneous layer or a layer formed by alternately stacked different dielectric layers. A patterned opening is provided on a mask layer 105 above, wherein the opening is etched to extend downward to form a through-hole 102. For this ultra-high aspect ratio etching process, charges will be gradually accumulated on the sidewall of the through-hole during downward extension of the etched hole. Since the through-hole is formed by a dielectric material, the charges can hardly be conducted away. The charges accumulated, mainly including positive charges and possibly a few negative charges, are distributed in a random asymmetrical fashion. After passing through the sheath on the substrate surface, the incident ions are repelled by the charges to decelerate during the downward movement procedure; as such, the downward moving ions do not have enough energy for further downward movement to etch the bottom of the etched hole, and then the etching reaction stops; or, the downward moving ions are repelled by the electric field formed by those asymmetrically distributed charges to be offset from the movement direction and are finally obliquely incident to the sidewall of the through-hole, resulting in an oblique etched through-hole.

With development of the etching process, the requirement on the etch aspect ratio becomes more and more stringent. A general practice in the industry is to constantly raise the RF power level compared to prior RF power supply configurations (e.g., a 2 MHz low-frequency RF power supply LF, a 60 MHz high-frequency RF power supply HF) so as to increase the energy of the RF fed into the reaction chamber, thereby raising the incident energy of ions to achieve ultra-high aspect ratio etching. However, this practice has a bottleneck for etching, namely, the "ions restricted" phenomenon mentioned above, such that the etching cannot proceed after reaching a certain depth. Meanwhile, the effective energy for downward ion bombardment is very little (about 3%), such that utilization of the input RF power is very low, causing enormous waste of the RF energy and dramatic surge of the costs of chip manufacturers.

Therefore, a novel plasma etching reactor with low energy consumption is desired in the industry, which can break through the bottleneck of ultra-high aspect ratio etching in the prior art and effectively perform an ultra-high aspect ratio etching process.

SUMMARY

An objective of the present disclosure is to provide a plasma etching reactor, which can be adapted to etching an ultra-high aspect ratio through-hole with lower energy consumption than the prior art.

The present disclosure provides a plasma reactor for ultra-high aspect ratio etching, comprising: a reaction chamber, inside which a reaction space is formed for a plasma etching process; a base disposed in the reaction space and configured for supporting a to-be-processed substrate; a gas showerhead disposed at the top inside the reaction chamber; a first radio frequency RF power supply connected to the base or the gas showerhead, for transmitting an RF power of a first frequency to the base or the gas showerhead to form and maintain the plasma in the reaction chamber; and a second RF power supply connected to the base, for transmitting a RF power of a second frequency to the base to control the ion energy incident to the base, the first frequency being not less than 4 MHz, and the second frequency being not less than 10 KHz but not more than 300 KHz; wherein a DC bias potential on the substrate surface generates a first accelerating electric field, the second RF power supply generates a second accelerating electric field, each output cycle of the second RF power supply including a positive half cycle and a negative half cycle, wherein during the positive half cycle, the first accelerating electric field drives ions in the plasma to accelerate toward the substrate to perform etching; and during the negative half cycle, the first accelerating electric field drives the ions in the plasma to accelerate toward the substrate to perform etching, and meanwhile the second accelerating electric field directly drives the ions in the plasma to accelerate toward the substrate to perform etching. Optionally, a duration of the second accelerating electric field is not less than 5/3 microseconds but not more than 50 microseconds. Preferably, the second frequency is not more than 200 KHz.

Optionally, the second frequency is preferably 100 KHz or 200 KHz, and the first frequency is 13.56 MHz or 27 MHz or 60 MHz and is preferably not less than 13 MHz.

Optionally, an output power of the second RF power supply is not less than 4 KW, facilitating the ions in the plasma to bombard the substrate within a RF power variation cycle.

In the present disclosure, the aspect ratio of the ultra-high aspect ratio is greater than 40:1.

Preferably, the first frequency is not less than 100 times the second frequency, which increases the number of times and duration for neutralizing charges in an ultra-high aspect ratio etched hole.

In another preferred embodiment of the present disclosure, the plasma etching reactor further comprises a third RF power supply which outputs a third frequency, the third frequency being greater than the second frequency but lower than the first frequency, wherein the second RF power supply and the third RF power supply are connected to the base via a match switching circuit, wherein the second RF power supply and the third RF power supply may be connected, via their respective match circuit, to the base. Correspondingly, the present disclosure provides a method for ultra-high aspect ratio etching using a plasma reactor, the method comprising: disposing a to-be-processed substrate on the base or a lower electrode; introducing an etch reactant gas; applying a high-frequency RF power with a frequency not less than 4 MHz to a lower electrode or an upper electrode inside the reaction chamber to form and maintain plasma, the high-frequency RF power outputting a first power; selecting, via a match switching circuit, a third RF power supply to the base; detecting a depth of the etched through-hole, controlling, when the etched depth exceeds a preset value, the second RF power supply to output a RF power to the base, and meanwhile controlling the high-frequency RF power to output a second power, the second power being greater than the first power.

The present disclosure further provides a plasma reactor having an ultra-low-frequency RF power supply drive, comprising: a reaction chamber, inside which a reaction space is formed to perform a plasma etching process; a lower electrode which is disposed in the reaction space and configured for supporting a to-be-processed substrate; an upper electrode disposed at the top inside the reaction chamber; a high-frequency RF power supply which outputs a high-frequency RF power to the lower electrode or the upper electrode so as to form and maintain plasma in the reaction chamber; an ultra-low-frequency RF power supply which outputs an ultra-low-frequency RF power to the lower electrode so as to control ion energy incident to the substrate, the high frequency being not less than 2 MHz, the ultra-low frequency is greater than 10 KHz but not more than 200 KHz; wherein a DC bias potential on the substrate surface generates a first accelerating electric field, and the second RF power supply generates a second accelerating electric field, each output cycle of the second RF power supply including a positive half cycle and a negative half cycle, wherein during the positive half cycle, the first accelerating electric field drives ions in the plasma to accelerate toward the substrate to perform etching, and during the negative half cycle, the first accelerating electric field drives the ions in the plasma to accelerate toward the substrate to perform etching and meanwhile the second accelerating electric field directly drives the ions in the plasma to accelerate toward the substrate to perform etching. Optionally, a duration of the second accelerating electric field is not less than 5/3 microseconds but not more than 50 microseconds. The plasma reactor according to the present disclosure may further comprise a low-frequency RF power supply, an output frequency of which is greater than an output frequency of the ultra-low-frequency RF power supply but lower than an output frequency of the high-frequency RF power supply, the low-frequency RF power supply and the ultra-low-frequency RF power supply being connected, via a match switching circuit, to the base.

Preferably, the first frequency in the present disclosure is not less than 13 MHz.

The present disclosure further provides a method for ultra-high aspect ratio etching, which is adapted to the plasma reactor, the method comprising: disposing a to-be-processed substrate on a base or a lower electrode; introducing an etch reactant gas;

applying a high-frequency RF power with a frequency not less than 4 MHz to the lower electrode or an upper electrode inside the reaction chamber so as to form and maintain plasma; meanwhile applying an ultra-low-frequency RF power with a frequency not less than 10 KHz to the lower electrode or the base inside the reaction chamber; etching a substrate surface using plasma; wherein when performing a plasma etching process, the ultra-low-frequency power applied on the lower electrode or the base drives, directly using a RF voltage, ions in the plasma, each output cycle of the second RF power supply including a positive half cycle and a negative half cycle, wherein during the positive half cycle, the first accelerating electric field drives the ions in the plasma to accelerate toward the substrate to perform etching; and during the negative half cycle, the first accelerating electric field drives the ions in the plasma to accelerate toward the substrate to perform etching, and meanwhile the second accelerating electric field directly drives the ions in the plasma to accelerate toward the substrate to perform etching; and wherein a DC bias potential on the substrate surface generates a first accelerating electric field, and the second RF power supply generates a second accelerating electric field. The selected combination of RF frequencies according to the present disclosure enables the ultra-low-frequency output voltage to vary periodically and cyclically, wherein each cycle includes a plurality of times of sheath collapse points, wherein at each sheath collapse point, electrons in the plasma enter an etched through-hole to neutralize the charges in the etched through-hole.

Meanwhile, the DC bias voltage affected by the ultra-low-frequency RF power also drives the ions to accelerate downward to bombard the substrate, thereby realizing joint etching. Particularly, the dielectric layer includes a first dielectric layer and a second dielectric layer which are alternately stacked. The aspect ratio of the through-hole etched by the dielectric layer is greater than 40. The first dielectric layer is made of silicon oxide, and the second dielectric layer is made of silicon nitride.

The ultra-low-frequency RF power according to the present disclosure is not less than 6 KW, and the high frequency RF power is not more than 10 KW or not more than 20 KW.

The etch gas applicable to the present disclosure includes fluorocarbon compounds or hydrofluorocarbon compounds.

BRIEF DESCRIPTION OF THE DRAWINGS

As part of the present disclosure, the drawings herein illustrate the embodiments of the present disclosure, which, along with the written description, are used for explaining and describing the principles and implementation modes of the present disclosure. The drawings are intended to schematically depict the main features of the embodiments.

DETAILED DESCRIPTION OF EMBODIMENTS

Hereinafter, the technical solution of the present disclosure will be described in detail with reference to the accompanying drawings. It needs to be emphasized that the embodiments provided herein are only for exemplary illustrations, not excluding other embodiments utilizing the idea of the present disclosure.

To overcome the drawbacks in the prior art, through researches, analysis, multiple times of trials and errors, experiments, and tests, the inventors invent and provide a capacitively coupled plasma etching reactor driven by an ultra-low-frequency RF power supply, wherein the ultra-low-frequency RF power supply (LF) is applied to a lower electrode of the capacitively coupled plasma etching reactor, the frequency range of the LF being not less than 10 KHz but not more than 300 KHz; a high-frequency RF power supply (HF) is applied to the lower electrode or an upper electrode, the RF frequency range of the HF being not less than 4 MHz, preferably 13.56 MHz or 27 MHz or 60 MHz.

The capacitively coupled plasma etching reactor driven by the ultra-low-frequency RF power supply may achieve high quality ultra-high aspect ratio etching, which can not only realize a deeper etching than the prior art, but also may avoid lateral etching due to repelling of the electric field in the sidewall of the etched hole; meanwhile, the power input required is also lower than the prior art. The ultra-high aspect ratio etching according to the present disclosure refers to a deep hole or a deep trench with an etching aspect ratio being at least 40:1.

Hereinafter, the principle of the present disclosure and the advantageous effects over the prior art will be illustrated in detail with reference to FIGS. 3 and 4.

Figure 1:
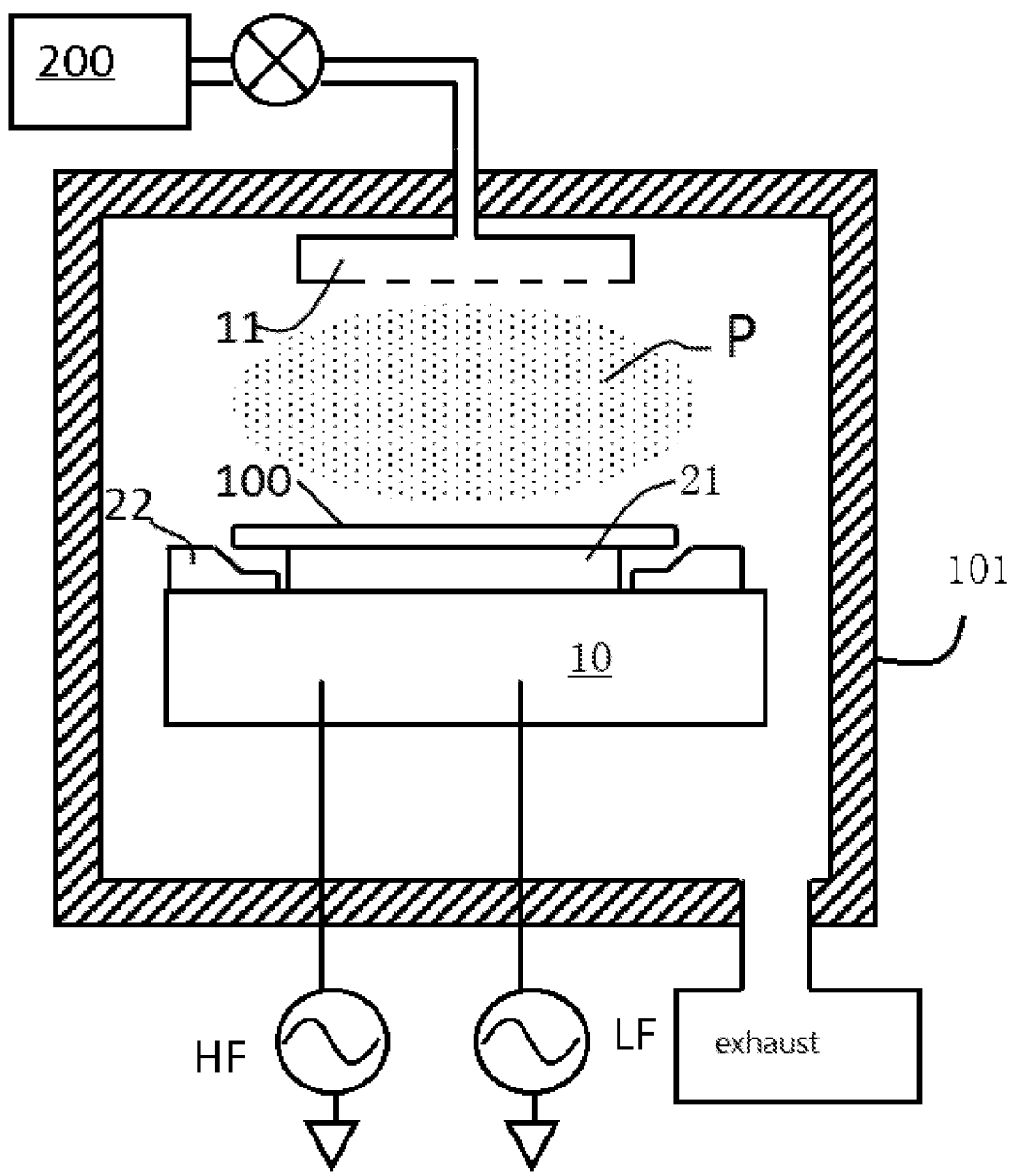
FIG. 1 is a schematic diagram of a plasma etching processor in the prior art.

The architecture configuration of the capacitively coupled plasma etching reactor driven by an ultra-low-frequency RF power supply according to the present disclosure is similar to the configuration shown in FIG. 1, except that the frequency of the low-frequency RF power supply (LF) takes an ultra-low frequency with a specific frequency range of not less than 10 KHz but not more than 300 KHz. Of course, in the etching reactor provided by the present disclosure, the high-frequency RF power supply (HF) may be disposed at the upper electrode (or gas showerhead) 11; likewise, the frequency of the low-frequency RF power supply (LF) takes an ultra-low frequency in a specific range of not less than 10 KHz but not more than 300 KHz. This setting also falls within the protection scope of the present disclosure.

Figure 2:
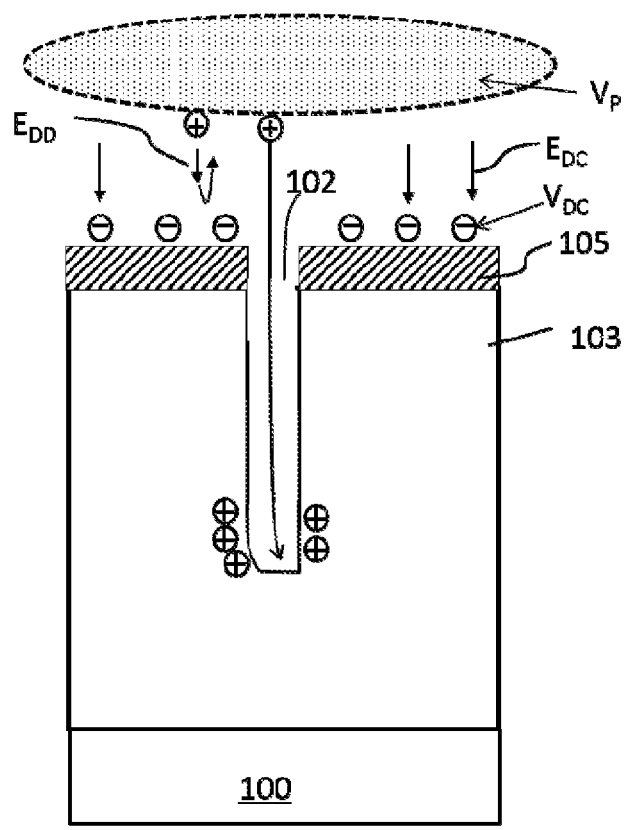
FIG. 2 is a schematic diagram of a motion trajectory of ions in conventional ultra-high aspect ratio etching.
Figure 3:
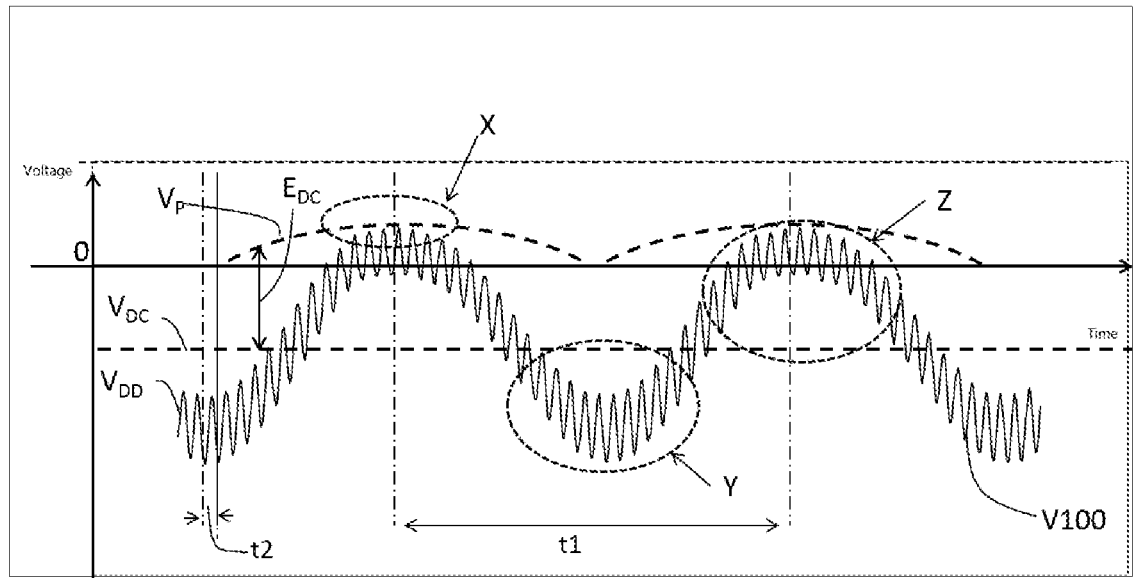
FIG. 3 is a schematic diagram showing RF voltage curves and various potentials affecting ion acceleration.
Figure 4:
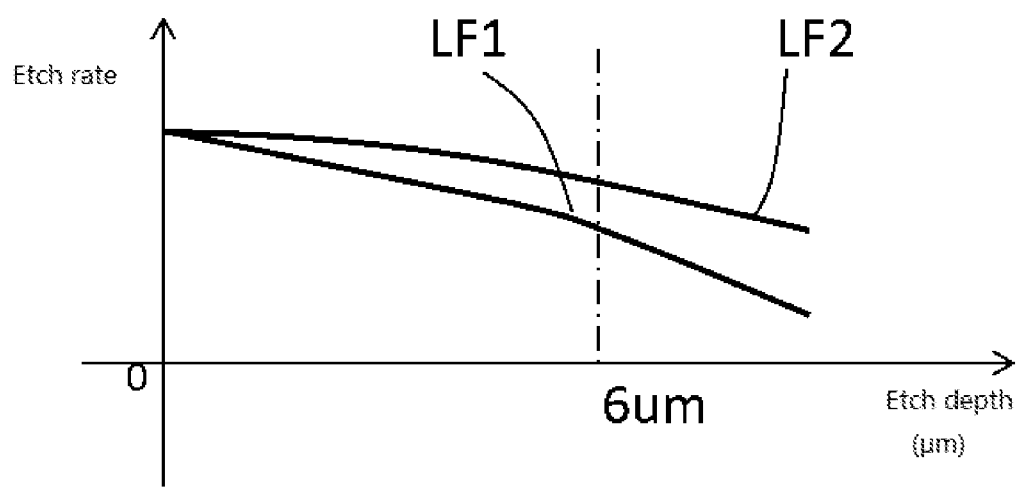
FIG. 4 is a comparison diagram between an etch rate-etch depth variation curve of the present disclosure and an etch rate-etch depth variation curve of the prior art when performing ultra-high aspect ratio etching.

FIG. 3 is a schematic diagram showing an RF voltage curve and various potentials affecting acceleration of ions in the plasma when the ultra-low-frequency capacitively coupled plasma etching reactor is performing plasma processing. In the figure, $V_P$ represents a potential of the plasma when performing plasma processing; $V_{DC}$ represents the DC bias voltage on the to-be-processed substrate when performing plasma processing, wherein the $V_{DC}$ is a negative-potential self-bias voltage formed on the substrate surface caused by accumulation of a large quantity of electrons on the substrate surface because the movement velocity of the electrons in the plasma is far higher than the movement velocity of the ions; $V_{DD}$ represents the RF voltage of the low-frequency RF power supply LF; the difference $V_P - V_{DC} = E_{DC}$ (also referred to as: DC acceleration voltage) between the plasma potential $V_P$ and the DC bias voltage $V_{DC}$ determines the DC accelerating electric field intensity for accelerating the ions in the plasma. As shown in FIG. 2, the DC acceleration voltage $E_{DC}$ may continuously accelerate the positively charged ions in the plasma downward for subsequent etching.

The present disclosure selects a very-low specific frequency of low-frequency RF such that when performing plasma etching, the ions in the plasma can realize dual-drive acceleration, which are $V_{DC}$ DC drive acceleration and $V_{DD}$ RF direct drive acceleration. Within the $t_1$ cycle shown in FIG. 3, the bias voltage ($V_{DC}$) on the sheath will accelerate the ions downward to bombard the substrate (referred to as: $V_{DC}$ DC drive acceleration) for performing etching; meanwhile, the ultra-low-frequency RF voltage ($V_{DD}$) will also directly drive the ions to accelerate downward to bombard the substrate (referred to as: $V_{DD}$ drive etching) for performing etching.

Hereinafter, the etching principle and process of the $V_{DD}$ RF direct drive acceleration of the present disclosure will be described in detail with reference to FIG. 3.

For the capacitively coupled plasma etching reactor with an ultra-low-frequency RF power supply provided by the present disclosure, because the frequency of the RF power supply applied to the lower electrode is 10~300 KHz, much lower than the frequency (1 MHz) adopted by the prior art; therefore, its cycle is much longer than the prior art. With a 100 KHz frequency as an example, the cycle length $t_1$ corresponding to the frequency in FIG. 3 is 10 μs; by selecting an output power (e.g., not less than 4 KW) matched to the ultra-low-frequency RF power, the acceleration time of the ions in the plasma is long enough and the acceleration voltage is high enough during the acceleration cycle of the ions in the plasma (i.e., the time segment circled by the dashed line Y in each cycle length $t_1$ in FIG. 3, namely, the half cycle with negative RF voltage), such that the ions in the plasma are sufficiently accelerated to pass through the sheath to bombard the substrate surface. The driving refers to direct driving the ions in the plasma to accelerate downwards directly using the RF voltage, which is thus referred to as $V_{DD}$ RF direct drive acceleration. After ion acceleration is completed, $V_{DD}$ then turns positive to generate a reversely upward force and take effect to push the ions newly generated in the plasma and the ions insufficiently accelerated during the preceding stage away from the substrate (the time segment circled by dashed line Z in each cycle in FIG. 3).

Compared with the prior art, the present disclosure solves the problem that there only exists $V_{DC}$ DC drive etching when performing plasma etching. The frequency of a conventional low-frequency RF power supply is far higher than the ultra-low frequency in the present disclosure, e.g., over 1 MHz. As shown in FIG. 3, the cycle length $t_1$ of the prior art is less than 1 μs; within an effective acceleration time segment (Y-area), the actual ion acceleration time is less than 0.5 μs; because the ions have a relative large mass and the acceleration time is relative short, during this interval of acceleration time, the ions, before being accelerated to an enough velocity to pass through the sheath to reach the substrate surface, are immediately turned into a positive electric field, decelerated, and reversely pushed upward away from the substrate surface (as shown in FIG. 2). In this case, the ions can only oscillate vertically such that they cannot be effectively accelerated downward.

In view of the above, the present disclosure selects a very low RF frequency, such that during the plasma etching process, the ions-accelerating electric field turns into a dual-acceleration electric field so as to perform ultra-high aspect ratio etching, which is a qualitative change compared with the prior art where there only exists $V_{DC}$ acceleration drive ion etching.

In the present disclosure, the $V_{DD}$ RF direct drive acceleration may bring about various inventive effects.

Because the $V_{DD}$ RF direct drive acceleration effect is directly correlated with the value of the ultra-low-frequency RF power, the ion incident energy may be accurately controlled by directly controlling the value of the ultra-low-frequency RF power. During the ultra-high aspect ratio etching process, with gradual increase of the downward extended depth of the etched hole, the present disclosure enables accurate control of the ion energy by controlling the value of the ultra-low-frequency RF power during the entire etching process, causing the ion energy to change gradually, thereby achieving the desired etching effect.

In the prior art, the low-frequency RF power supply LF has a RF frequency of 1 MHz~2 MHz; within this frequency selection range, the ion energy incident on the substrate surface can only by tuned by tuning the output power of the low-frequency RF power supply. However, when performing ultra-high aspect ratio etching, the low-frequency RF power supply LF in the prior art can only be controlled by power, such that the output of its low-frequency RF power supply reaches 20 KW or higher. Such a high output power not only has a high cost, but also generates a large quantity of excessive heat; therefore, a large-power heat dissipation mechanism needs to be equipped in the plasma etching reactor; besides, the very high voltage (over 10,000 volt) easily causes electrical discharge of various gases in the plasma reactor, causing plasma instability and easily damaging those components inside the reactor.

Additionally, when a conventional etching machine performs ultra-high aspect ratio etching, a very large low-frequency RF power output is needed in order to cause the ions to reach the deep enough through-hole bottom. Although increase of power output may increase the downward incident energy of the ions, there is still some energy to dissociate the etch gas, causing variations of the concentration and compositions of the plasma above the substrate, and such variations will be superimposed with the dissociation effect of the high-frequency RF power, which increases the difficulty of RF power control. Moreover, the etch gas includes a considerable amount of fluorocarbon compounds or hydrofluorocarbon compounds; when these compositions are massively dissociated due to supply of ultra-high-power low-frequency RF power, excessive polymers will be deposited at the sidewall and opening of the etched through-hole, causing the opening to be closed, such that the etching cannot further proceed downward. The above problems caused by too high low-frequency RF power significantly increase the processing and fabrication costs of the plasma etching reactor.

To overcome the problems in the prior art, the present disclosure provides an optimized frequency range, such that a very large ion incident energy may be obtained by a small increase in the ultra-low-frequency RF power.

Besides, in the present disclosure, the mean voltage value of $V_{DD}$ in the acceleration time segment may be greater than $V_{DC}$; therefore, the quantity and energy of the ions downward bombarded onto the substrate surface will be significantly higher than the quantity and energy of the ions in the prior art adopting an equivalent bias RF power.

Preferably, in the prior art, due to use of the ultra-low-frequency RF power, the power of the ultra-low-frequency RF power supply may be selected smaller than the prior art. Preferably, the power of the ultra-low-frequency RF power supply in the present disclosure is above 4 KW, which can achieve a technical effect that can only be achieved by a higher frequency (greater than 1 MHz) with a higher power over 10 KW. Therefore, when performing ultra-high aspect ratio etching, the present disclosure may significantly reduce the ultra-low-frequency RF power.

The ultra-low-frequency power source setting of the present disclosure may have a better de-couple effect under the same high-frequency RF power supply. The ultra-low frequency and the high frequency may be separately controlled so as to implement separate control of different energies and concentrations in the plasma. In the present disclosure, a 10 KHz~300 KHz low-frequency RF power can avoid the low-frequency RF power from dissociating the etch gas and from interfering with control of the plasma concentration distribution, thereby decoupling the control effects of low-frequency RF power and high-frequency RF power. Therefore, in the case of de-coupling, the low-frequency RF power in the present disclosure may be set higher, e.g., 30 KW, without significantly affecting distribution of the plasma concentration and compositions in the reaction chamber, avoiding the problem in the prior art that two RF powers affect each other when the low-frequency RF power is very high.

FIG. 3 further shows a curve V100 of RF voltage applied to the substrate. The RF voltage curve V100 is formed by superimposition of the voltage of the ultra-low-frequency RF power supply (LF) and the voltage of the high-frequency RF power supply (HF). Because the output power/output voltage (e.g., 7000~10000V) of the ultra-low-frequency RF power supply LF is far higher than the voltage outputted by the high-frequency RF power supply HF (e.g., about hundreds of volts), the voltage of V100 generally fluctuates greatly with the output voltage of the ultra-low-frequency RF power supply LF; because V100 is further superimposed with the high-frequency RF voltage, the curve V100 further includes a considerable amount of high-frequency small amplitude oscillations. The output voltage of the ultra-low-frequency RF power supply (LF) has a variation cycle, corresponding to a cycle length $t_1$. With 100 KHz as an example, the corresponding cycle length $t_1$ is 10 μs, wherein the oscillation cycle length corresponding to the high-frequency RF power supply (HF) is t2; and with 27 MHz as an example, the cycle length $t_2$ is about 0.04 μs. When the output voltage of the ultra-low-frequency RF power supply LF oscillates to the highest point, the potential on the substrate surface will be raised to approximate the potential of the plasma P; at this point, the sheath of the substrate surface collapses, such that the electrons and the charged ions in the plasma will be free from sheath restriction so as to move freely into the etched through-hole; in this way, the accumulated charges in the etched through-hole 102 (as shown in FIG. 2) can be neutralized or conducted away. However, the time segment during which the sheath collapses and the accumulated charges are removed is very short. For example, there are 6 to 7 voltage peak moments in area X in FIG. 3, which are closest to the potential of the plasma P; and the sheath thickness decreases to a certain threshold only in several time segments within this range, such that the electrons can overcome sheath obstruction to move downward, and the charges accumulated in the etched through-hole can be eliminated; while in remaining time, due to existence of the sheath, the electrons cannot be moved freely downward. To enable more sheath to approach to collapse, the plasma is downward diffused to the substrate surface. As a preferred embodiment of the present disclosure, the output frequency of the high-frequency RF power supply (HF) is selected to be higher than 100 times the output frequency of the ultra-low-frequency RF power supply (LF); in this way, more sheath collapse points will appear in area X shown in FIG. 3, which facilitates eliminating the accumulated charges and obtaining a vertical etched through-hole.

Therefore, as a preferred embodiment of the present disclosure, in the apparatus for etching an ultra-high aspect ratio through-hole according to the present disclosure, the output frequency of the ultra-low-frequency RF power supply LF is selected to be 100 KHz or 200 KHz; in this way, a higher energy may be imparted to the ions without much increase of the low-frequency RF power output; on the other hand, the output frequency of the high-frequency RF power HF is selected to be higher than 100 times of the output frequency of the ultra-low-frequency RF power LF, e.g., 27 MHz or 60 MHz. In this way, the ultra-high aspect ratio etching can be better achieved, and meanwhile the charges accumulated in the etched through-hole can be eliminated, thereby improving the morphology of the etched through-hole.

In FIG. 3, elimination of the charges in the etched hole only occurs for a few times in each cycle $t_1$. Therefore, the time interval $t_1$ cannot be too long; otherwise, enough charge accumulation possibly still occurs within one cycle, causing inclination of the ion incident direction. In other words, the output frequency of the ultra-low-frequency RF power supply LF cannot be too low, which needs to be not less than 10 KHz so as to guarantee timely elimination of the charges accumulated on the sidewall of the etched hole. The output frequency ranges of the high-frequency HF and ultra-low-frequency LF RF power supplies provided in the present disclosure enable a better etching of an etched hole with a very large depth (8 μm), and without a very large ultra-low-frequency RF power, a depth, which can only be etched with a higher power in the prior art, may be achieved. The high-frequency RF power and the ultra-low-frequency RF power can also be controlled completely separately without mutual interference.

In the above embodiments, the lower electrode of the etching apparatus is simultaneously connected to a high-frequency RF power supply and an ultra-low-frequency RF power supply. It should be understood that the inventive spirit and idea of the present disclosure is also applicable to the case of applying a high-frequency RF power supply to the upper electrode and applying the ultra-low-frequency RF power supply to the lower electrode, wherein the frequency of the ultra-low-frequency RF power supply also ranges from 10 KHz to 300 KHz.

Corresponding to the above etching apparatus, the present disclosure further provides an ultra-high aspect ratio etching method using the plasma etching reactor, which is particularly suitable for 3D NAND etching.

The etching method comprises:
disposing a to-be-processed substrate on a base or a lower electrode;
introducing an etch reactant gas;
applying a high-frequency RF power to the lower electrode or an upper electrode in the reaction chamber so as to form and maintain plasma;
meanwhile applying an ultra-low-frequency RF power to the lower electrode or the base in the reaction chamber; and
etching the substrate surface using plasma;
wherein when performing a plasma etching process, the ultra-low-frequency power applied to the lower electrode or the base directly drives the ions in the plasma by directly using a RF voltage, such that the ions accelerate downward to bombard the substrate within a half variation cycle of the ultra-low-frequency RF power so as to perform etching; meanwhile, DC bias voltage $V_{DC}$ affected by the ultra-low-frequency RF power also drives the ions to accelerate downward to bombard the substrate, thereby jointly performing etching.

The substrate includes an underlayer, a dielectric layer disposed on the underlayer, and a mask layer disposed on the dielectric layer. The dielectric layer has a thickness of over 5 μm.

The dielectric layer includes a first dielectric layer and a second dielectric layer which are alternately stacked.

The first dielectric layer is made of silicon oxide, and the second dielectric layer is made of silicon nitride.

The aspect ratio of the through-hole etched by the dielectric layer is greater than 40.

An output power of the ultra-low-frequency RF power supply is not less than 6 KW, and an output power of the high-frequency RF power supply is not more than 10 KW.

The output power of the high-frequency RF power supply is not more than 20 KW.

The etch gas introduced into the reaction chamber via the gas showerhead includes a fluorocarbon compound or a hydrofluorocarbon compound.

The output voltage of the ultra-low-frequency RF power supply varies periodically and cyclically, wherein each cycle includes a plurality of times of sheath collapse points; at the sheath collapse point, the electrons in the plasma enter the etched through-hole to neutralize the charges in the etched through-holes.

Figure 5A:
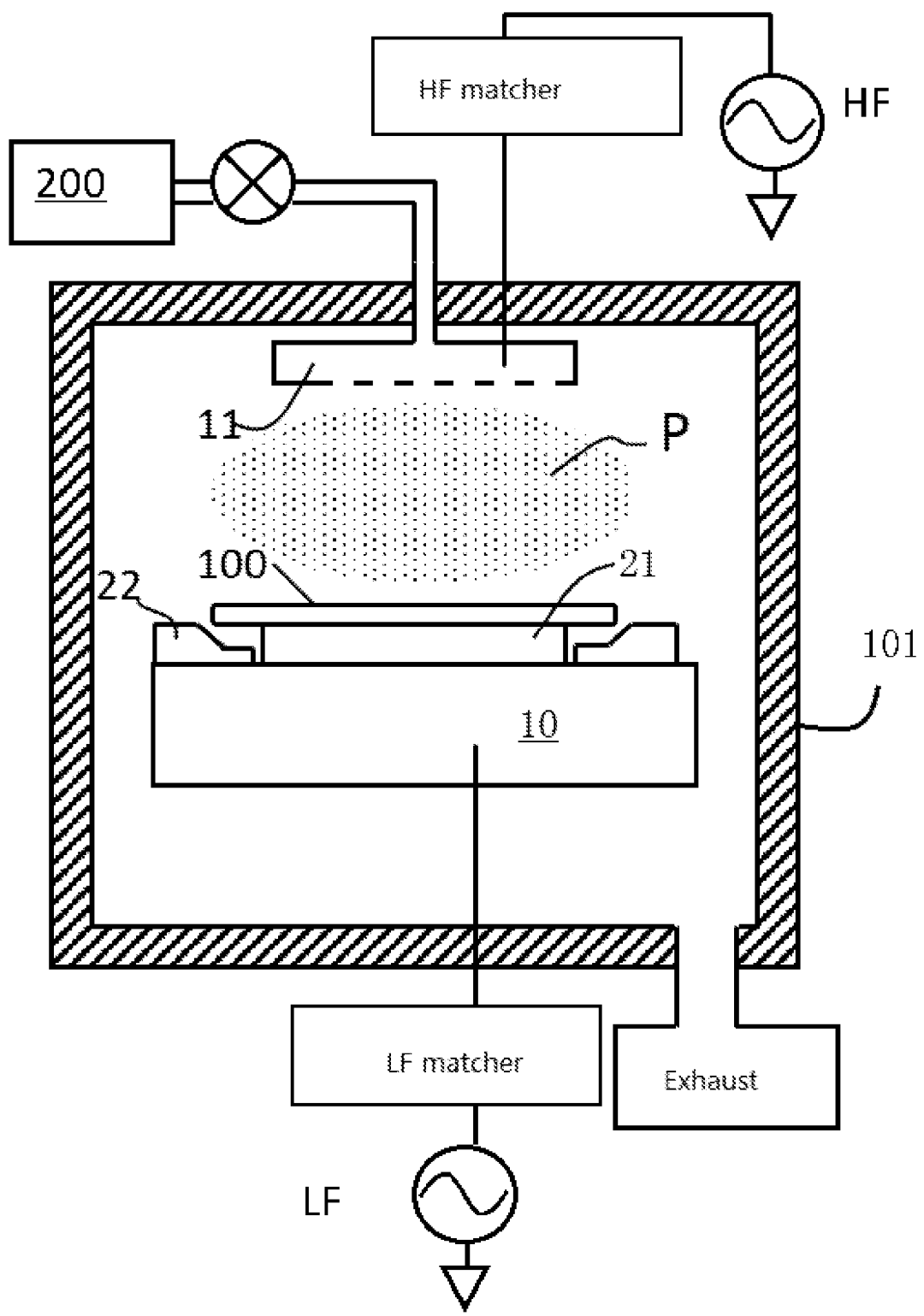
FIG. 5a is a diagram of an embodiment of a plasma etching reactor according to the present disclosure.

The present disclosure adopts an ultra-low-frequency RF power as a bias power source, which, together with the high-frequency RF power supply, performs ultra-high aspect ratio etching to the substrate. When the two RF power supplies are simultaneously connected to the lower electrode in the reaction chamber, it is needed to provide match circuits between the lower electrode and the two RF power supplies, wherein the match circuits each include a filter with optimal parameters, which only allows for power with the RF power supply output frequency to pass through while blocking RF powers with other frequencies. For example, the filter circuit in the matcher corresponding to the ultra-low-frequency RF power supply has a very low impedance to a 10~300 KHz RF power, such that power with such frequencies can pass through smoothly; while it has a very high impedance to a 60 MHz high-frequency RF power so that it can prevent reversely flowing into the bias power source. Besides the two fundamental frequencies outputted by the RF power supplies, the RF powers of the two frequencies are commonly outputted to one lower electrode, the signals with the two frequencies will be mutually interfered with and superimposed to form many new extra frequencies. These noisy frequencies include HF±LF frequencies and frequency multiplication harmonics with a larger power. Because the LF frequency in the prior art may reach as high as 1 MHz, for the corresponding source RF power (60 Mhz), the noisy frequencies 59 MHz and 61 MHz need to be filtered by the filter in the matcher, which may be filtered by optimizing parameters of the filter, while a 60 MHz effective power is allowed to pass. In the present disclosure, because the frequency of the bias RF power supply LF is extremely low (with LF being 200 KHz as an example), correspondingly for the source RF power, the noisy frequencies that need to be filtered are 59.8 MHz and 60.2 MHz. Because the two noisy frequencies are both very close to the fundamental frequency 60 MHz, it is hard for the conventional filter method to design parameters, such that it is impossible to effectively filter the 59.8/60.2 MHz frequencies while allowing the 60 MHz power to pass. For this problem, the present disclosure provides an embodiment of plasma etching reaction shown in FIG. 5a, wherein the high-frequency RF power supply HF in FIG. 5a is connected to the upper electrode (i.e., the gas showerhead), and the low-frequency RF power supply is connected to the lower electrode. Because most of the RF current of the low-frequency RF power supply will be coupled to the reaction chamber sidewall via plasma and then return to the LF matcher, wherein only a small proportion of RF power will be coupled to the upper electrode, the HF matcher can only detect a small amount of ultra-low-frequency RF power when performing impedance matching, which thus can effectively monitor the high-frequency RF output power and the reflective power. This avoids the circumstance in which the high-frequency RF power, when being connected to the lower electrode, is seriously interfered by the ultra-low-frequency RF power, wherein such a serious interference would result in that the high-frequency RF power matching cannot be effectively performed, the plasma cannot be stabilized, and a large amount of RF power is wasted.

The present disclosure is applicable to an ultra-high aspect ratio etching process. FIG. 4 shows etch rate variation curves when etching to different depths with different frequencies of a low-frequency RF. In the figure, LF1 reviews that when the prior art adopts 1 MHz, the etch rate drops quickly as the etched hole extends downward and the depth increases. As the etch rate quickly drops, a large amount of etch gas cannot reach the bottom of the etched hole to proceed with the downward etching, such that the etch gas will laterally etch the sidewall of the etched hole. Even the etched hole finally reaches the desired depth, the profile of the etched hole will be seriously deformed, causing bowing sidewall and undercut of the material below the mask layer 105. The LF2 curve in FIG. 4 reveals the etch rate variation curve using the ultra-low-frequency (100 KHz) bias RF power supply according to the present disclosure. It is seen that in the present disclosure, the etch rate drops relatively slowly with the depth, and a large amount of etch gas can etch downward, which reduces damages to the sidewall. With the ultra-low-frequency RF power, the present disclosure can increase the ion incident power by a great margin, such that the polymer layer at the bottom of the etched hole can be removed by the downward incident high-energy ions, causing the etching to proceed downward.

Figure 5B:
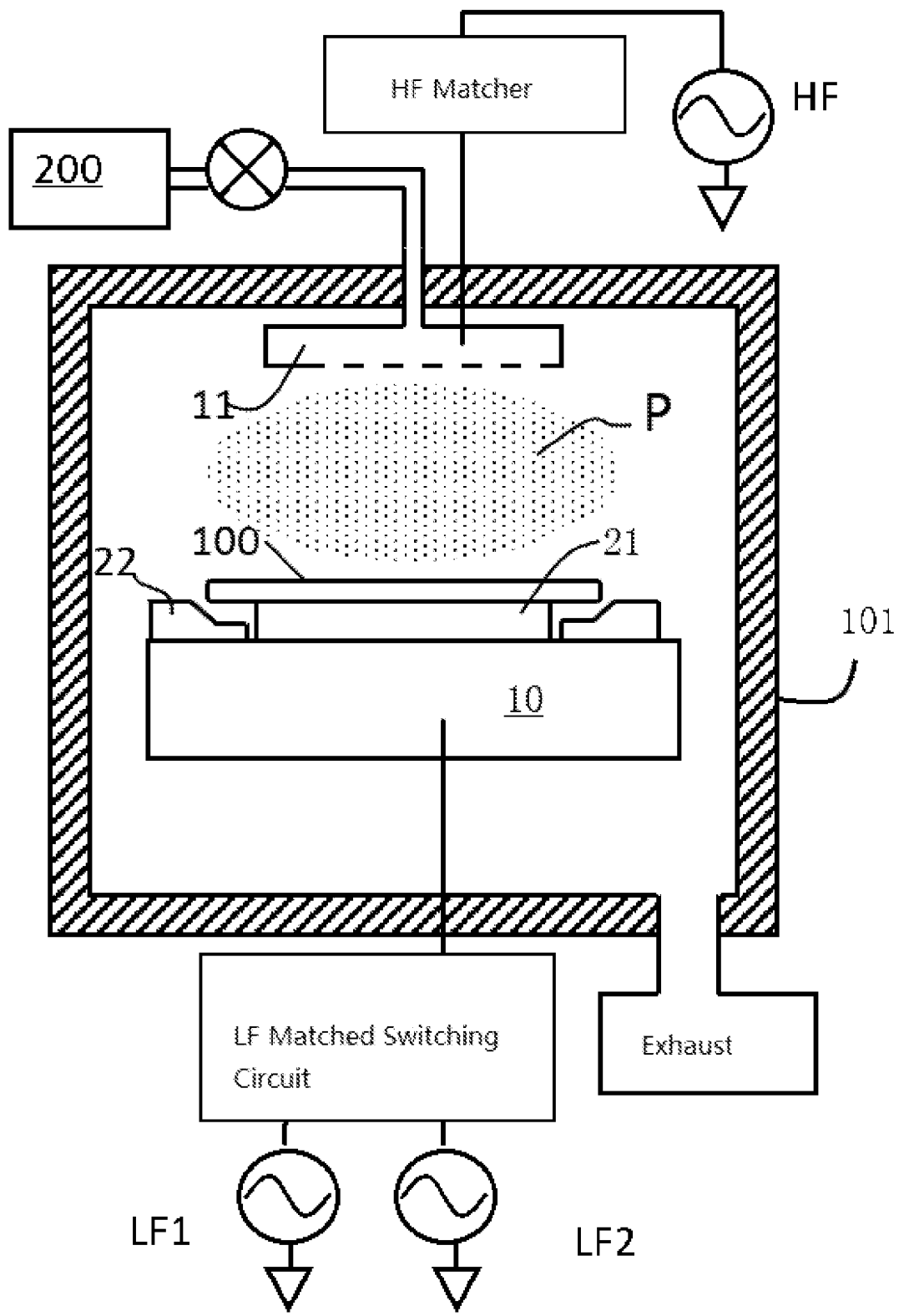
FIG. 5b is a diagram of another embodiment of a plasma etching reactor according to the present disclosure.

With the ultra-low-frequency RF power according to the present disclosure, because the reactant gas cannot be dissociated with the ultra-low frequency, the concentration of the plasma and the concentration of the radicals in the reactant gas will drop. To guarantee an enough etch rate, the value of the high-frequency RF power needs to significantly increase. For example, in the prior art, the output power of 60 MHz is 1200 W, and the etch gas (including fluorocarbon compounds and hydrofluorocarbon compounds) with the 10000 W output power of the low-frequency RF power supply 2 MHz is introduced as reactant gas. When adopting the ultra-low-frequency RF power according to the present disclosure, to achieve a similar etching effect, the output power for 60 MHz is 3500 W; meanwhile, the output power of the ultra-low-frequency RF power supply 10~300 KHz is 5000~8000 W. Therefore, with the ultra-low-frequency RF power, the etch rate during the high aspect ratio etching process may increase, and the power of the bias RF power supply is lowered by a small portion; however, the cost is a significant increase of the high-frequency RF power. To further improve the high aspect ratio etching process, the present disclosure further provides another embodiment, as shown in FIG. 5b. The structure of FIG. 5b is substantially identical to that of FIG. 5a, except that two low-frequency RF power supplies LF1 and LF2 are configured for connecting to the lower electrode, wherein LF1 and LF2 are connected to the lower electrode via a match switching circuit; during the procedure of etching a high aspect ratio through-hole, in the first stage with a relatively low etch depth (lower than 6 m), the bias RF power with a relatively high frequency LF1 is first applied to the lower electrode, wherein the frequency range of LF1 is from 2 MHz to 13.56 MHz; meanwhile, a high-frequency (HF) RF power with a relatively low power is applied to the upper electrode or the base, wherein the frequency of HF is not less than 4 MHz.

As an example, when LF1 frequency is 13.56 MHz, the HF frequency is not less than 27 MHz. It is seen from the diagram of the relationship between the etch rate and the etch depth shown in FIG. 4 that during this procedure, although the etch rate of LF1 low-frequency RF power is slightly lower than the ultra-low-frequency RF power LF2 with the same power, it may save a large amount of high-frequency (HF) RF power. When the etch depth reaches 6 m, the match switching circuit switches to output the ultra-low-frequency (LF2) power to the lower electrode, and meanwhile stops RF power output from the LF1 RF power supply to perform second-phase etching; in this way, a relatively high etch rate can be still maintained in the second stage of the etching process to preventing etching the sidewall of the etched hole, finally reaching the desired etch depth. When performing the second-phase etching, the frequency of the ultra-low-frequency RF power supply may be selected to 100 KHz or 200 KHz.

Figure 5C:
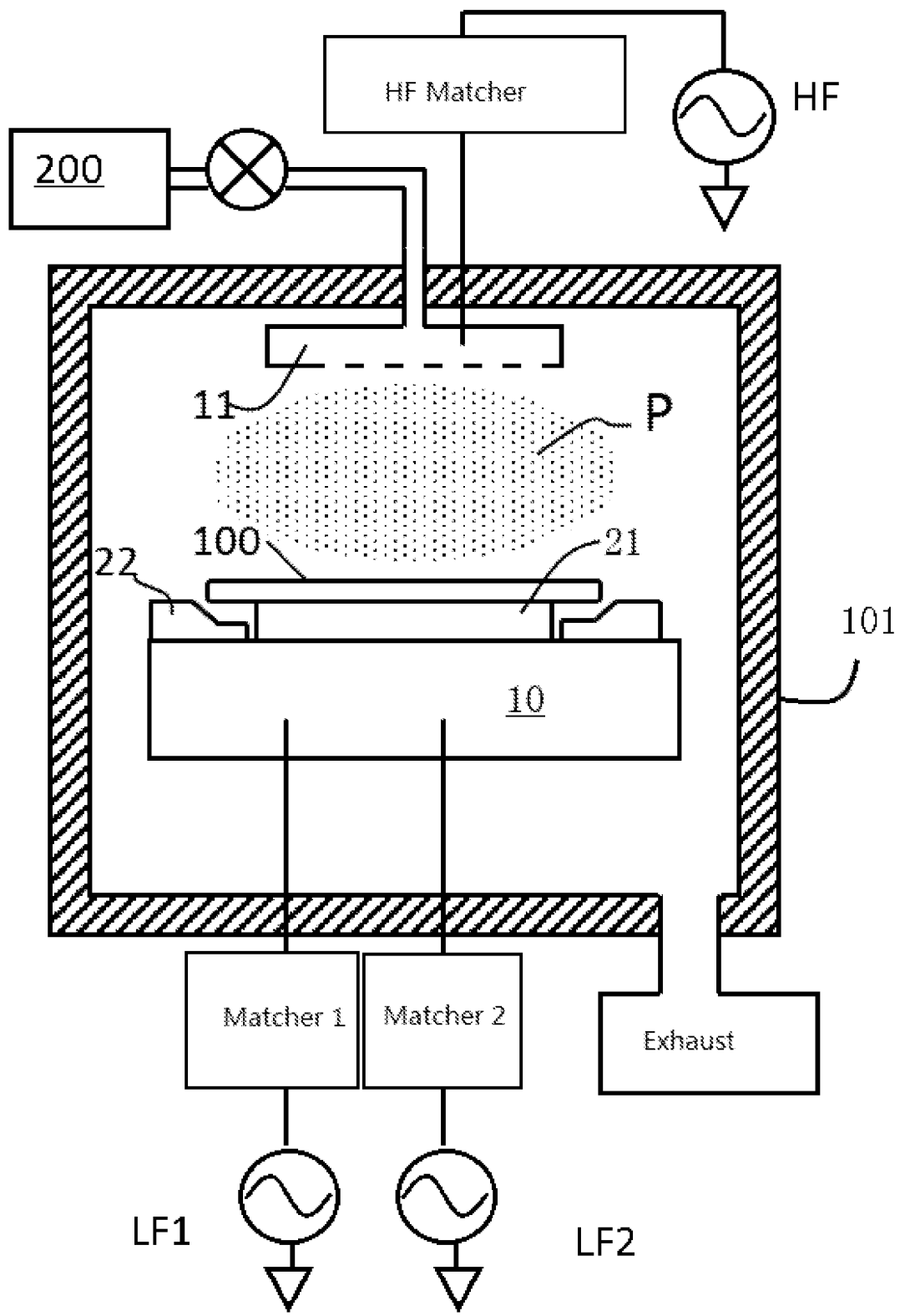
FIG. 5c is a diagram of a further embodiment of a plasma etching reactor according to the present disclosure.

Finally, during the entire etching process, power consumption in the first-phase etching is significantly reduced, and the etch rate and the etched hole profile can be still guaranteed in the second-phase etching. In the present disclosure, two RF power supplies (LF1, LF2) may share one match switching circuit; or, as shown in FIG. 5c, the two RF power supplies have their own matcher 1 and matcher 2, respectively, each RF power supply outputting a RF power to the base via their respective matcher. The switching circuit may comprise a toggle switch or a series of switch assembly; optionally, it can be a non-tangible switch. Any switch that can implement switching between outputs of multiple RF powers may be applied to the present disclosure. For example, when it is needed to output the current RF power (LF1) to the base, the output of the RF power supply (LF1) is closed, and meanwhile the other RF power supply (LF2) starts outputting via its own matcher; in this way, switching between RF powers can be still implemented without a toggle switch.

Figure 6A:
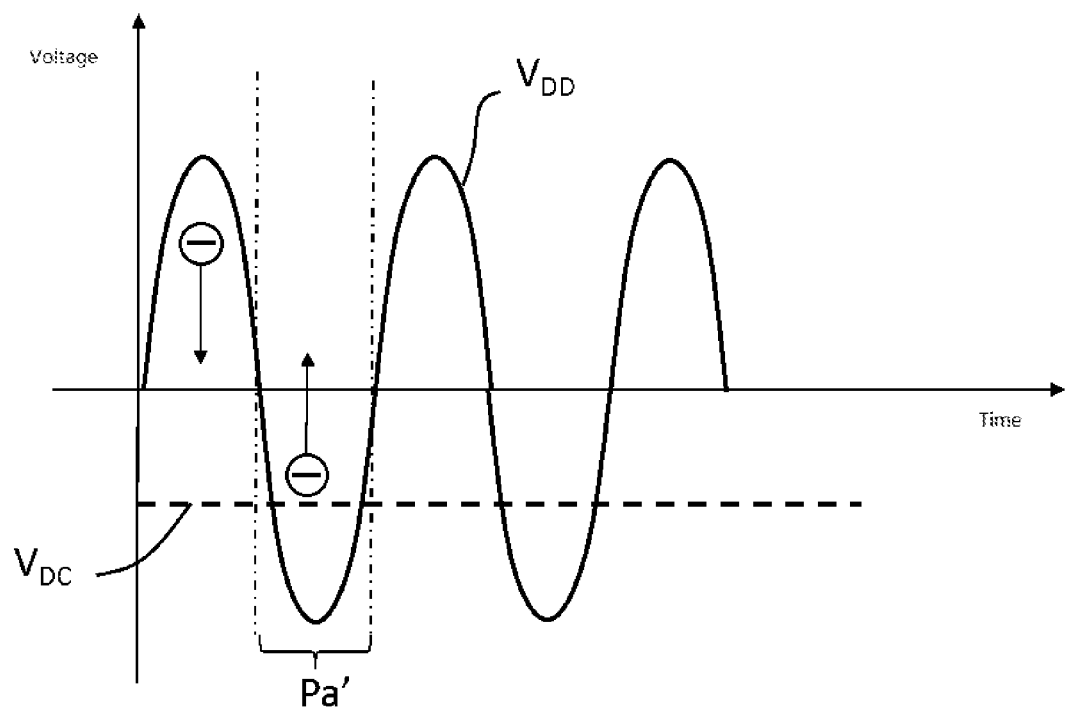
FIG. 6a is a schematic diagram of motions of electrons and ions on a substrate surface driven by a low-frequency RF power in the prior art.
Figure 6B:
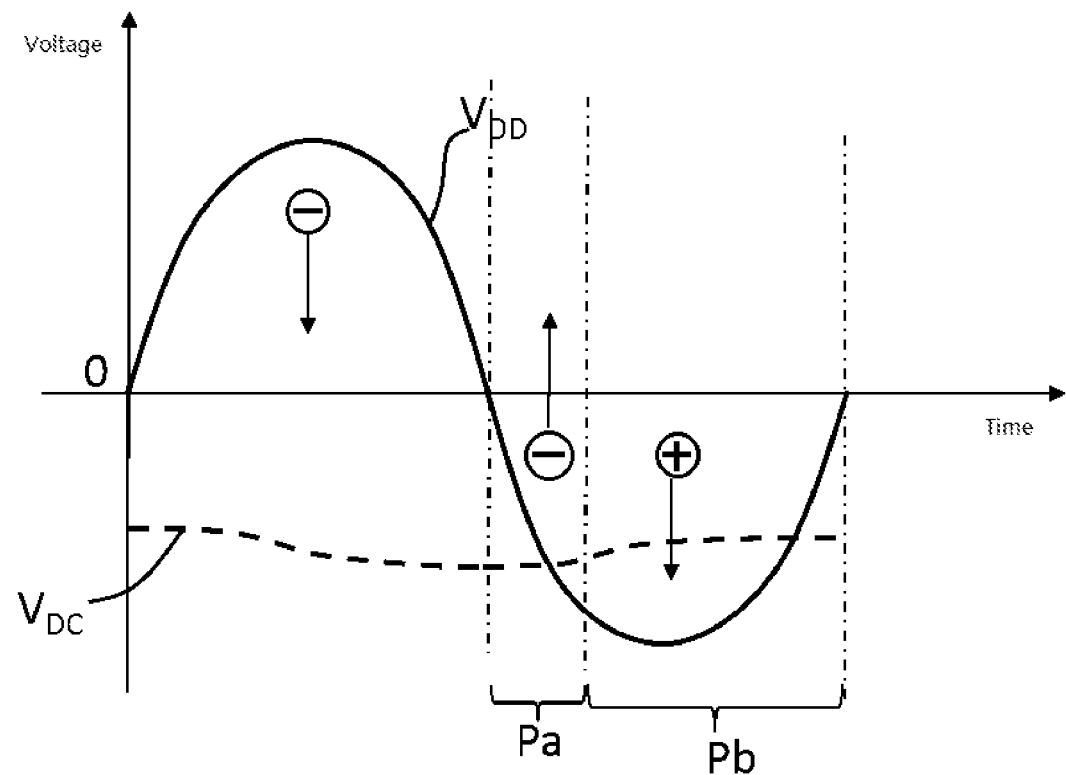
FIG. 6b is a schematic diagram of motions of electrons and ions on a substrate surface driven by an ultra-low-frequency RF power in the present disclosure.

FIG. 6a shows a schematic diagram of motions of electrons and ions on the substrate surface driven by a low-frequency RF power in the prior art; FIG. 6b shows a schematic diagram of motions of electrons and ions on the substrate surface driven by an ultra-low-frequency RF power according to the present disclosure. It may be seen from FIG. 6a that the prior art adopts a low-frequency RF power above 400 KHz, wherein when the low-frequency RF power maintains stable, the electrons in the plasma are driven by the low-frequency electric field to move downward in the positive half cycle of the low-frequency RF power, while in the negative half cycle, the electrons are pushed away from the substrate; meanwhile, because the time length Pa' of the negative half cycle is relatively short, the electric field is reversed before the ions reach the substrate, such that no ions are directly driven downward by the low-frequency electric field. The DC bias potential $V_{DC}$ accumulated on the substrate surface maintains stable. As shown in FIG. 6b, the present disclosure adopts an ultra-low-frequency RF power such that the cycle of the low-frequency alternating current signal outputted to the lower electrode is significantly prolonged. Each output cycle of the ultra-low-frequency RF power supply includes a positive half cycle and a negative half cycle, wherein there exists a first accelerating electric field $V_{DC}$ for accelerating the ions in the positive half cycle, and in the negative half cycle, both the first accelerating electric field $V_{DC}$ and a second accelerating electric field $V_{DD}$ for accelerating the ions are existent, wherein $V_{DD}$ denotes an accelerating electric field applied by the ultra-low-frequency RF power source to the ions in the plasma. When the output frequency of the ultra-low-frequency RF power supply is not more than 300 KHz, the duration of the second accelerating electric field $V_{DD}$ is greater than 1.7 ms; while when the output frequency of the ultra-low-frequency RF power supply is not more than 200 KHz, the duration of the second accelerating electric field $V_{DD}$ is not less than 2.5 ms.

In the positive half cycle, the electrons are driven by the ultra-low-frequency voltage $V_{DD}$ downward to reach the substrate surface; the long-term accumulated charges cause increase of the negative bias amplitude of the bias voltage $V_{DC}$ on the substrate surface; during the time segment Pa in the negative half cycle, the electrons are pushed away from the substrate, and the ions in the plasma start accelerating downward; after entering the Pb time segment, the downward moving ions are accelerated with an enough speed to bombard the substrate surface and the etched hole; meanwhile, a great amount of positively charged ions arrive, causing the negative bias potential accumulated on the substrate surface to diminish; however, during the entire ultra-low-frequency bias power signal cycle, the negative bias voltage can still maintain fluctuating within a small range.

It may be seen from FIG. 6b that the $V_{DD}$ in the positive half cycle of the ultra-low-frequency bias power signal cannot drive the ions to move downward, and the ions can only be accelerated downward by the $V_{DC}$; however, in the negative half cycle, the $V_{DD}$ and the $V_{DC}$ simultaneously drive the ions to accelerate downward. The reason for generation of the $V_{DC}$ is that the movement speed of the electrons in the plasma is faster than that of the ions, such that a negative bias potential is established on the substrate surface; as such, the $V_{DC}$ negative bias distribution is affected by the plasma concentration above the substrate, wherein an area with a higher concentration correspondingly has a higher $V_{DC}$. Further, the ion concentration distribution is affected by the high-frequency RF power (typically greater than 10 MHz) distribution; during transmitting the high-frequency RF power between the upper electrode and the lower electrode, due to the impact of skin effect, the RF current is distributed unevenly on the surface of the lower electrode 10, resulting in a plasma distribution morphology where the plasma at the substrate center and edge has a higher concentration, while the concentration in the middle portion is low lower; correspondingly, the $V_{DC}$ distribution is also non-uniform; therefore, it is hard for the prior art to obtain the most uniform ion incident energy distribution only using $V_{DC}$ driving. In the present disclosure, because the $V_{DD}$ is directly applied between the upper electrode 10 and the lower electrode 11, the upper and lower electrodes are parallel electrode plates close to each other, and the $V_{DD}$ has an ultra-low frequency (<300 KHz) with a less obvious skin effect, a very uniformly distributed electric field may be generated between the upper electrode and the lower electrode, and the ion incident energy distribution driven by the $V_{DD}$ is more uniform. Due to use of the ultra-low-frequency bias power source, the present disclosure not only enables driving the ions downward by two kinds of voltages during the negative half cycle of the ultra-low-frequency bias signal, but also offers a more uniform ion energy distribution. Although the content of the present disclosure has been described in detail through preferred embodiments, it should be noted that the description above is not a limitation to the present disclosure. After having read the above content, various modifications and substitutions to the present disclosure are obvious to those skilled in the art. Therefore, the protection scope of the present disclosure should be limited by the appended claims.

We claim:

1. A method for plasma etching a substrate in a reaction chamber, comprising:
   disposing a to-be-processed substrate on a base or a lower electrode of the reaction chamber;
   introducing an etch reactant gas;
   applying a high-frequency RF power, having a frequency not less than 4 MHz to the lower electrode or an upper electrode inside the reaction chamber so as to form and maintain plasma having a plasma potential and generate a bias DC voltage on the substrate;
   meanwhile applying an low-frequency RF power with a frequency not less than 10 KHz but not more than 300 KHz, and voltage of 7000V to 10,000V, to the lower electrode or the base inside the reaction chamber, whereby the high frequency RF power is superimposed on the low frequency RF power, thereby generating a plurality of voltage fluctuations within each cycle of the low frequency RF power; and
   etching the substrate surface using the plasma;
   wherein when performing the plasma etching process, the low-frequency power drives directly ions in the plasma, during each RF cycle of the low frequency RF power, including a positive half cycle and a negative half cycle, wherein during the positive half cycle, the bias DC voltage drives the ions in the plasma to accelerate toward the substrate to perform etching; and during the negative half cycle, the bias DC voltage drives the ions in the plasma to accelerate toward the substrate to perform etching, and meanwhile the low frequency RF power directly drives the ions in the plasma to accelerate toward the substrate to perform etching; and
   wherein during each positive cycle voltage fluctuations reach the plasma potential to cause a plurality of times of sheath collapse points, and wherein at each sheath collapse point, electrons in the plasma enter an etched through-hole to neutralize the charges in the etched through-hole.

2. The etching method according to claim 1, wherein a duration of an accelerating electric field generated by the low frequency RF power is not less than 5/3 microseconds but not more than 50 microseconds.

3. The etching method according to claim 1, wherein an aspect ratio of a through-hole etched on the sample is greater than 40.

4. The etching method according to claim 1, wherein the low-frequency radio frequency power is not less than 6 KW, and the high-frequency radio frequency power is not more than 10 KW.

5. The etching method according to claim 1, wherein the high-frequency radio frequency power is not more than 20 KW.

6. The etching method according to claim 1, wherein the etch gas includes a fluorocarbon compound or a hydrofluorocarbon compound.

7. The etching method according to claim 1, wherein the sample includes a first dielectric layer and a second dielectric layer which are alternately stacked.

8. The etching method according to claim 7, wherein the first dielectric layer is made of silicon oxide, and the second dielectric layer is made of silicon nitride.

9. A method for plasma etching using a plasma reactor having a first frequency RF power supply, a second frequency RF power supply and a third frequency RF power supply, the third frequency being greater than the second frequency but lower than the first frequency, comprising:
   disposing a substrate on a base of the plasma reactor;
   introducing an etch reactant gas;
   applying the first frequency RF power with a frequency not less than 4 MHz to a lower electrode or an upper electrode inside the reaction chamber to form and maintain plasma, the first frequency RF power outputting a first power;
   applying the third frequency RF power to the base to perform a first-phase etching;
   detecting a depth of an etched through-hole, and when the etched depth exceeds a preset value, applying the second frequency RF power to the base, and meanwhile controlling the high-frequency RF power to output a second power to perform second-phase etching, the second power being greater than the first power.

10. The method according to claim 9, wherein when performing the second-phase etching, the frequency of the second frequency RF power supply is set to 100 KHz or 200 KHz.

11. The method according to claim 9, wherein in the first-phase etching, the third radio frequency power supply is applied to the base via the match switching circuit.

12. The method according to claim 9, wherein the first frequency is 13.56 MHz or 27 MHz or 60 MHz.

13. The method according to claim 9, wherein the third frequency is not less than 2 MHz but not more than 13.56 MHz.

* * * * *